(12) United States Patent
Jiang et al.

(10) Patent No.: US 7,664,808 B2
(45) Date of Patent: Feb. 16, 2010

(54) EFFICIENT REAL-TIME COMPUTATION OF FIR FILTER COEFFICIENTS

(75) Inventors: Zhongnong Jiang, Plano, TX (US);
Rustin W. Allred, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 995 days.

(21) Appl. No.: 11/159,618

(22) Filed: Jun. 23, 2005

(65) Prior Publication Data

US 2005/0262177 A1 Nov. 24, 2005

Related U.S. Application Data

(62) Division of application No. 10/012,657, filed on Oct. 30, 2001, now Pat. No. 7,007,052.

(51) Int. Cl.
*G06F 17/10* (2006.01)
(52) U.S. Cl. .................................................... 708/319
(58) Field of Classification Search ................. 708/319

See application file for complete search history.

(56) References Cited

U.S. PATENT DOCUMENTS 4,805,129 A * 2/1989 David .......................... 708/300
5,157,623 A * 10/1992 Hayashi ....................... 708/320

* cited by examiner

*Primary Examiner*—Tan V Mai
(74) *Attorney, Agent, or Firm*—John J. Patti; Wade J. Brady, III; Frederick J. Telecky, Jr.

(57) ABSTRACT

Systems and methods for determining coefficients of an Finite Impulse Response (FIR) filter are disclosed. The FIR filter coefficients are computed by determining a sine of an input value and an inverse of the input value. The sine of the input signal and the inverse of the input signal are multiplied together to form a sinc value of the input value. The sinc value is employed to determine the coefficient. The system and method can be repeated to compute any number of FIR filter coefficients in real-time. The sine of the input signal is computed utilizing a memory lookup table. The memory lookup table includes pairs of uniformly distributed values for the sine and cosine functions in the range of 0 to π. The inverse of the input value is computed using an inverse memory lookup table, a most significant digit and a remainder. The coefficient is then computed from a product of the sine of the input signal and the inverse of the input signal. Thus, the coefficient is computable in real-time without the use of previously computed and stored coefficients.

14 Claims, 10 Drawing Sheets

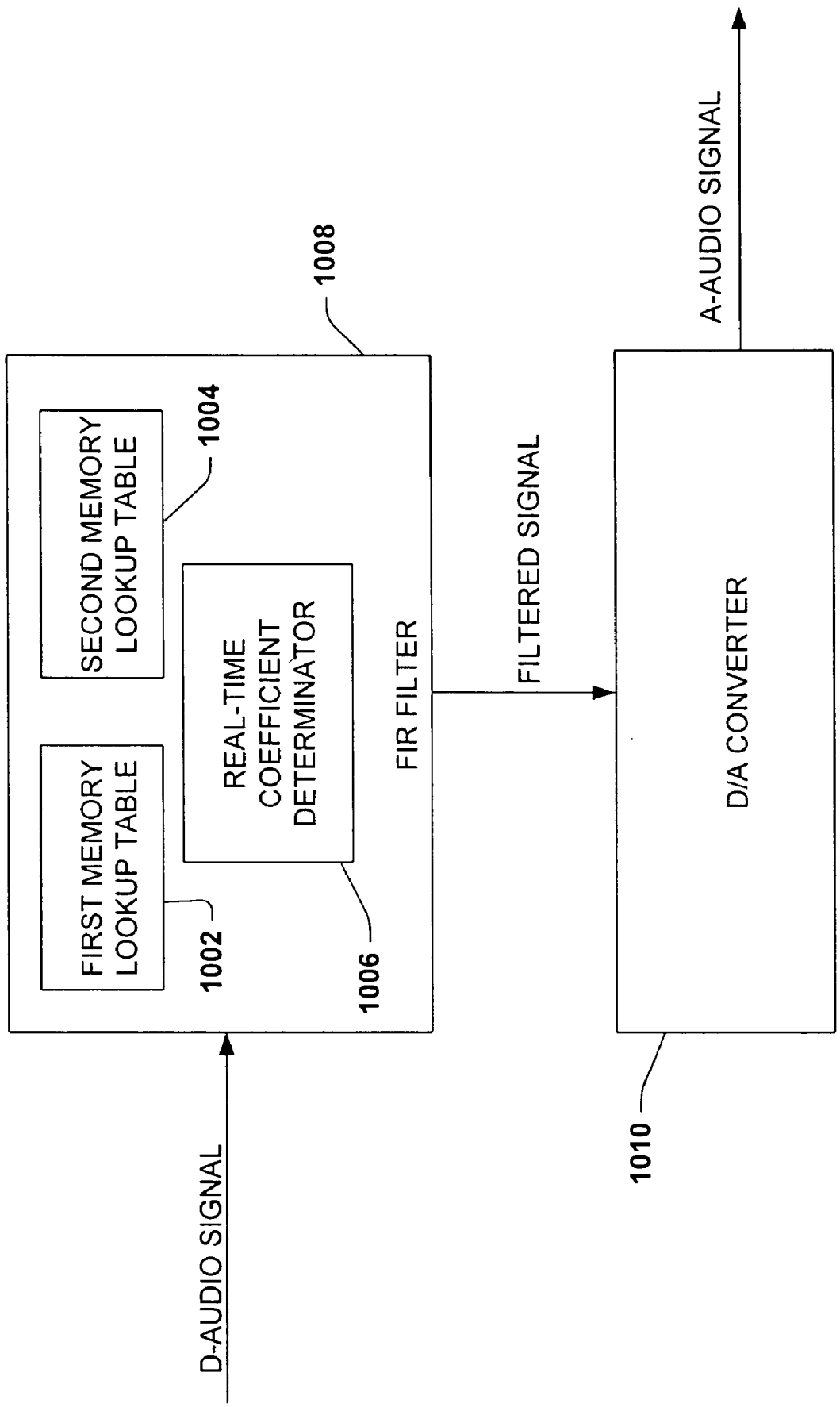

EFFICIENT REAL-TIME COMPUTATION OF FIR FILTER COEFFICIENTS

This application claims priority under 35 USC §120 of application Ser. No. 10/012,657, filed Oct. 30, 2001 now U.S. Pat 7,007,052. This application is a divisional of the above mentioned application.

TECHNICAL FIELD

The present invention generally relates to digital signal processing and, in particular, to real-time computation of FIR filter coefficients.

BACKGROUND OF THE INVENTION

FIR (finite impulse response) filters are widely used in signal processing systems such as digital signal processors (DSP). FIR filters are generally used to operate on a digital signal to decimate (reduce sampling rates), interpolate (increase sampling rates), and/or remove or filter out unwanted frequencies.

An FIR filter has a number of characteristics and parameters associated with it. An impulse response is actually just the set of FIR filter coefficients. Thus, if an "impulse" which consists of a "1" sample followed by many "0" samples is input into an FIR filter, the output of the filter will be the set of coefficients, as the 1 sample moves past each coefficient in turn to form the output. An FIR "TAP" is simply a coefficient/delay pair. The number of FIR TAPs, (often designated as "N") is an indication of 1) the amount of memory required to implement the filter, 2) the number of calculations required, and 3) the amount of "filtering" the filter can do. In effect, more TAPs means more stopband attenuation, less ripple, narrower filter transitions, etc. Multiply-Accumulate (MAC), in an FIR filter, is the operation of multiplying a coefficient by the corresponding delayed data sample and accumulating the result. FIR filters usually require one MAC per tap.

FIR filters are commonly implemented with symmetric coefficients to provide a linear phase response. A filter having a linear phase response is a filter that exhibits a constant change in phase angle as a function of frequency. This type of filter response is highly desirable for many applications, such as communications. In these cases, the number of taps is often denoted as 2N or 2N+1. However, only N or N+1 coefficients need to be created due to the symmetry.

One goal of FIR filter design is to increase the number of coefficients and or TAPs. Typical, conventional FIR filters used today employ thousands of coefficients, millions of coefficients or more. These conventional FIR filters compute the large number of coefficients and store them in read only memory (ROM) prior to filter operation. Computing such a large number of coefficients is prohibitively expensive to compute in real-time and is also prohibitively expensive to store. System designers employ many hours of CPU time to search for the coefficients that are best suited for the requirements. However, for applications such as digital domain sample rate conversion, the number of coefficients of the FIR digital filters can reach a level of hundreds, thousands or even millions. For such levels of FIR filters, optimization techniques and/or a huge memory physically storing all the possible coefficients are not feasible. Thus, computing the digital filter coefficients in real-time becomes an indispensable option.

There are a number of conventional approaches to computing coefficients. A first approach is to compute all of the coefficients off-line, as described above, before filtering and store them in read only memory (ROM). Then, the coefficients are recalled from memory during FIR filter operation. However, this approach is not realistic for the large number of coefficients typically used in FIR filters of today because a large amount of storage is required.

A second approach to compute coefficients is to use linear interpolation in real-time. According to this approach, a portion of a large number of coefficients are computed and stored in ROM. During real-time filter operation, coefficients are computed from interpolating between values stored in the ROM. This approach does reduce the size of memory used compared to the first approach (from tens of millions to hundreds of thousands of words), however a large memory is still required and the coefficients calculated from interpolation may not be as accurate as required.

A third approach is to use a multi-stage filter in combination with the second approach. Multiple stages of filters are used instead of a single filter in order to reduce the size of memory used. However, a large amount of memory is still required to store pre-computed coefficients and the coefficients calculated from interpolation may not be as accurate as desired.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention provides for a system and method for computing FIR filter coefficients in real-time. The FIR filter coefficients are computed by determining a sine of an input value and an inverse of the input value. The sine of the input signal and the inverse of the input signal are multiplied together to form a sinc value of the input value. The sinc value is employed to determine the coefficient. The system and method can be repeated to compute any number of FIR filter coefficients. The sine of the input signal is computed utilizing a memory lookup table. The memory lookup table includes pairs of uniformly distributed values for the sine and cosine functions in the range of 0 to $\pi$. The inverse of the input value is computed using an inverse memory lookup table, a most significant digit and a remainder. The coefficient is then computed from a product of the sine of the input signal and the inverse of the input signal. Thus, the coefficient is computable in real-time without the use of previously computed and stored coefficients.

In one aspect of the invention, the system and method for computing FIR filter coefficients in real-time is employed in a DSP. The DSP can be used in any number of applications, such as audio, video, communications and the like, employing an FIR filter system.

The following description and the annexed drawings set forth in detail certain illustrative aspects of the invention. These aspects are indicative, however, of but a few of the various ways in which the principles of the invention may be employed. Other advantages and novel features of the invention will become apparent from the following detailed description of the invention when considered in conjunction with the drawings.

BRIEF DESCRIPTION OF THE DRAWINGS

FIG. 10 is a block diagram of an audio decoder according to yet another aspect of the present invention.

DETAILED DESCRIPTION OF THE INVENTION

The present invention will now be described with reference to the drawings. The present invention will be described with reference to a system and method for computing FIR filter coefficients in real-time. The FIR filter coefficients are computed by determining a sine of an input value and an inverse of the input value. The sine of the input signal and the inverse of the input signal are multiplied together to form a sinc value of the input value. The sinc value is employed to determine the coefficient. The system and method can be repeated to compute any number of FIR filter coefficients. The sine of the input signal is computed utilizing a memory lookup table. The memory lookup table includes pairs of uniformly distributed values for the sine and cosine functions in the range of 0 to $\pi$. The inverse of the input value is computed using an inverse memory lookup table, a most significant digit and a remainder. The coefficient is then computed from a product of the sine of the input signal and the inverse of the input signal. Thus, the coefficient is computable in real-time without the use of previously computed and stored coefficients.

Although the present invention is described with respect to an FIR filter system, it is appreciated that the present invention applies to performing sine, inverse and sinc functions and/or equivalents thereof in other systems. The present invention is particularly applicable in digital signal processor systems, audio processing systems and any system where a large number of coefficients are desired to be calculated in real-time.

Figure 1:
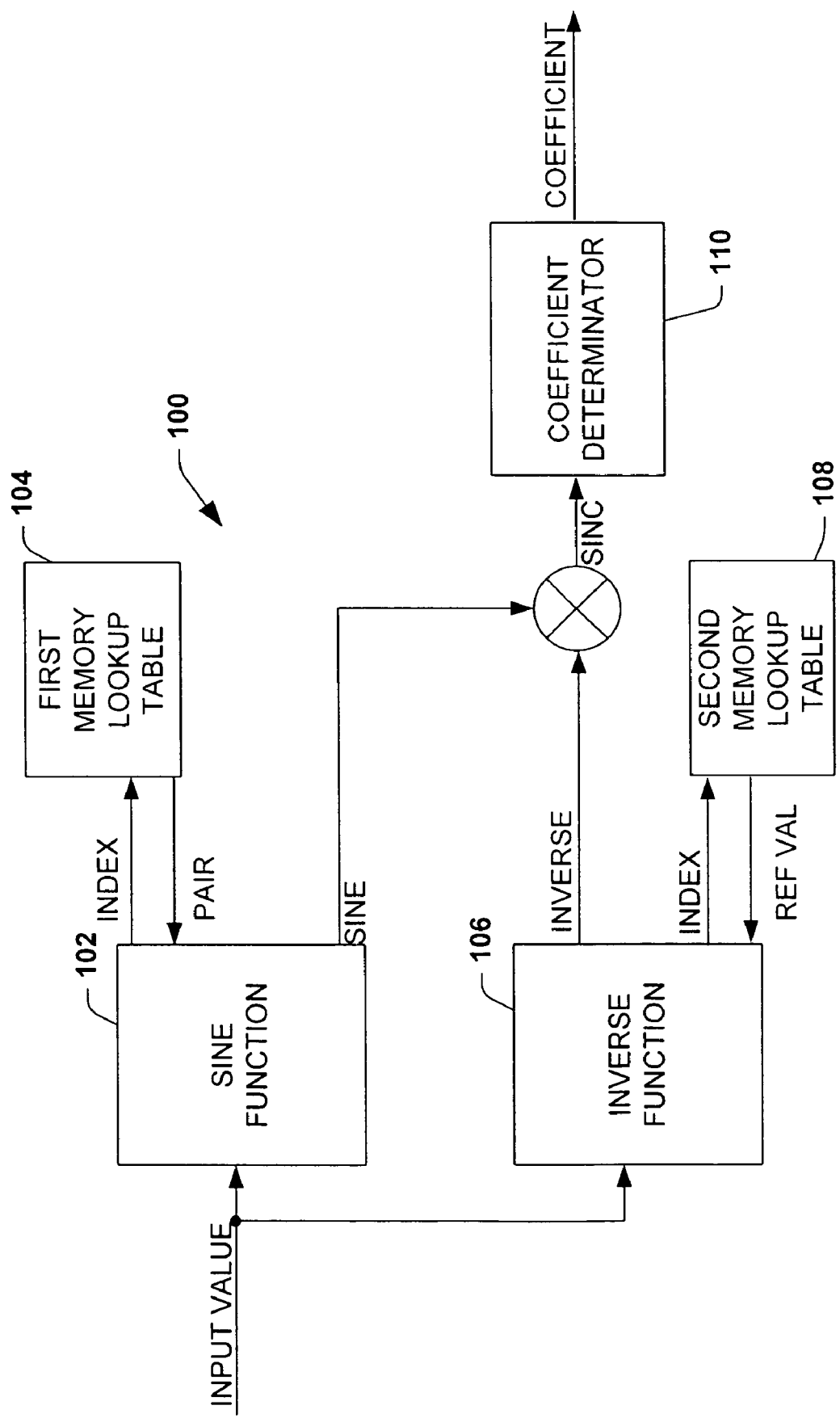
FIG. 1 illustrates a system for determining a coefficient of an FIR filter according to one aspect of the present invention.

FIG. 1 illustrates a system 100 for determining a coefficient of an FIR filter according to one aspect of the present invention. The system 100 is described with respect to computing a coefficient, but it is appreciated that the system 100 is able to compute a large number of coefficients in real-time without utilizing previously computed and/or stored coefficients. The large number of coefficients can be in the millions or higher, yet the system 100 uses only a small amount of memory on the order of a hundredth or less than the number of coefficients. The filtering aspects of the FIR filter are provided by an impulse response of the filter, which is the set of all coefficients of the filter. The FIR filter is also defined by the number of "TAP"s, which are, simply, coefficient/delay pairs of the filter. The FIR filter may be a linear phase response filter having symmetric coefficients. The number of TAPs for such a linear phase response filter is often denoted as 2N or 2N+1 although only N or N+1 coefficients need to be created due to the symmetry of the coefficients.

A sine function 102 receives an input value. The input value corresponds to a coefficient or TAP of the FIR filter. The input value is one of a range of values for $\omega_0 n$, for n being an integer from 0 to N and $\omega_0$ being the cutoff frequency of the filter. The sine function 102 computes an index value from the input value. The index value can be the input value. The sine function references a first memory lookup table 104 with the index value. The first memory lookup table 104 returns a sine/cosine pair and a closest tabled value. The sine function 102 computes an offset value from the index value and the closest tabled value. The sine function 102 computes a sine of the input value as a function of the offset value and the sine/cosine pair.

Due to the periodicity of the sine function, only values between 0 and $2\pi$ of the input value need to be computed. If the value of the sine function at some angle $\theta$ is already known, then, due to a small deviation $\Delta$ from this angle the new sine value may be calculated as:

$$\sin(\theta \pm \Delta) = \sin\theta \cos\Delta \pm \theta \sin\Delta \quad (1)$$

where $\Delta > 0$ is a much smaller number compared to the value of $\pi$. By invoking the following approximations:

$$\cos\Delta \approx 1 - \Delta^2/2 \text{ and } \sin\Delta \approx \Delta \quad (2)$$

Then, Eq. (1) becomes:

$$\sin(\theta \pm \Delta) \approx \sin\theta \pm \Delta(\cos\theta \mp 0.5\Delta \sin\theta) \quad (3)$$

Thus, Eq. 3 can be used to find the sine of the input value where $\Delta$ is the offset value and $\cos\theta$ and $\sin\theta$ are the retrieved sine/cosine pair.

The first memory lookup table 104 may be partially implemented in memory. The memory may be any type of memory or storage device such as read only memory, dynamic access memory, flash memory, hard drives and the like. The first memory lookup table 104 has a number of pairs of sine/cosine values corresponding to tabled values. The greater the number of pairs, the greater the accuracy of the sine function 102. The first memory lookup table 104 receives the index value from the sine function 102. The first memory lookup table 104 finds the closest tabled value to the index value. The first memory lookup table 104 returns the sine/cosine pair associated with the closest tabled value, along with the closest tabled value.

To find out how great the errors would be when using the approximation expression (3), various maximum $\Delta$ values can be examined. It can be shown that if 128 pairs of uniformly distributed values for the sine and cosine functions in the range of 0 to $\pi$ are stored in a memory table, any other sine values can be evaluated with an accuracy of 16 bits or better by using Eq. (3). By simply changing the sign of the sine values for the angles falling between 0 to $\pi$, their counterpart sine values, with angles complementary to $2\pi$, can be readily obtained. Further reduction of the number of the stored sine/cosine values can be achieved based on its symmetric property of the sine function: the sine value reaches the peak, equal one, at π2, which is the symmetric point; but π/2 is the anti-symmetric point for the cosine function. Given the above analysis and the fact that the sine function has zero value at 0 and π, only 64 pairs of sin/cosine values need to be stored in a memory table to yield an accuracy of at least 16 bits.

Figure 2:
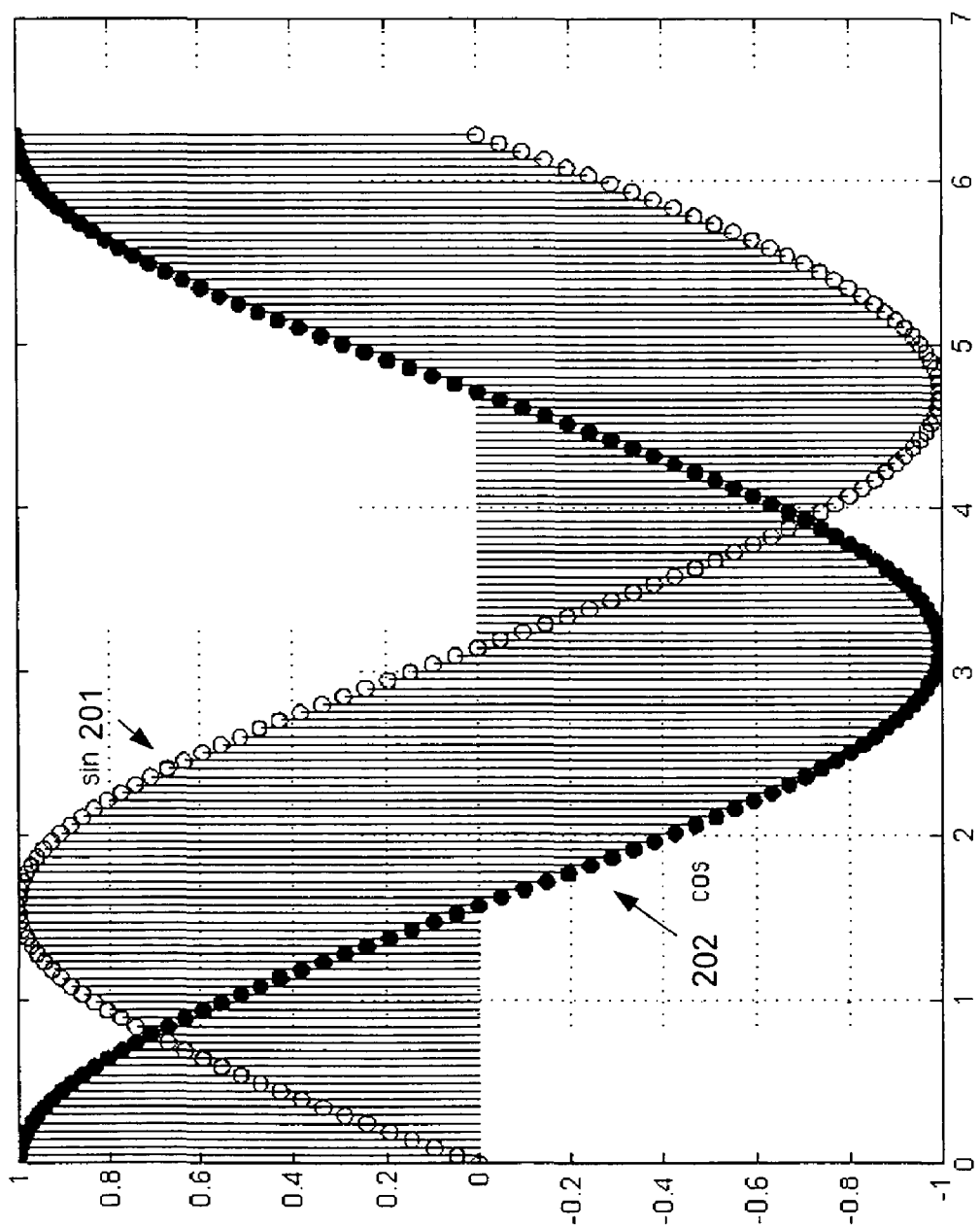
FIG. 2 illustrates a graph of stored sine/cosine pairs for use with the present invention.

FIG. 2 illustrates a graph of stored sine 201 and cosine 202 pairs for use with the present invention. The graph illustrates 64 sine/cosine pairs along with their respective tabled values. The x axis is shown with values ranging from 0 to π and the y axis is shown with values ranging from −1 to 1. Additionally, the x axis illustrates values for tabled values and the y axis illustrates the sine 201 and cosine 202 of the respective tabled values. It is appreciated that other numbers of sine/cosine pairs may be used and be in accordance with the present invention.

An inverse function 106 also receives the input value. The inverse function 106 computes an index value and references a second memory lookup table 108 with the index value. The second memory lookup table 108 returns a reference value corresponding to the index value. The inverse function 106 utilizes the reference value with piecewise linearization to compute an inverse of the input value.

Figure 3:
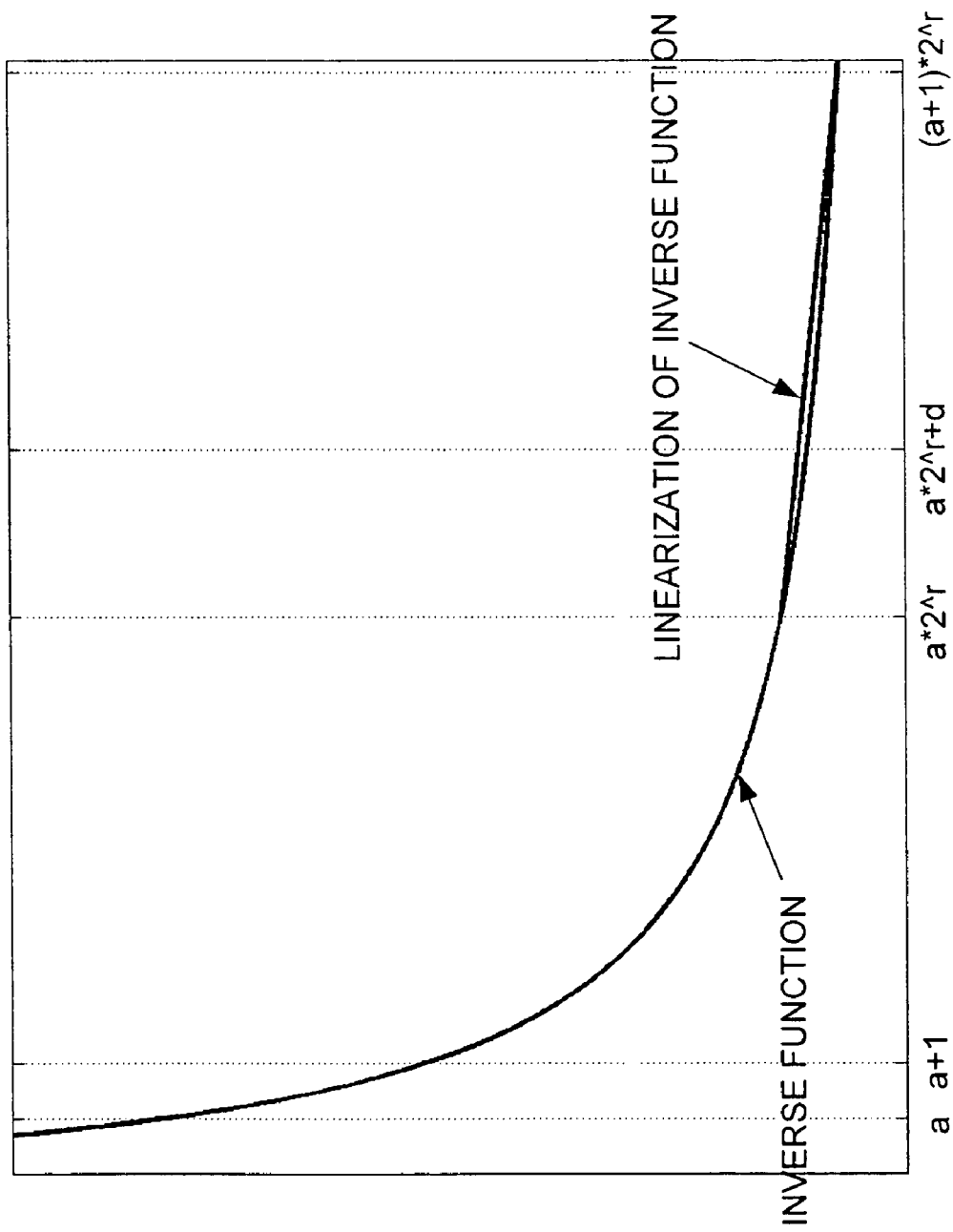
FIG. 3 illustrates a graph utilizing piecewise linearization for use with the present invention.

FIG. 3 illustrates a graph utilizing piecewise linearization with respect to the inverse function 106. A pair of neighboring integers, a and a+1, are shown in FIG. 3. The x axis shows tabled values (integers) and the y axis shows reference values for the corresponding tabled values. The inverses of a and a+1 are known. Another integer of which the inverse is not known is $a \cdot 2^r + d$, which is between $a \cdot 2^r$ and $(a+1) \cdot 2^r$. The "d" represents the distance from $a \cdot 2^r$ of the unknown inverse.

Thus, the following equations can be obtained:

$$\frac{1}{a \cdot 2^r + d} \approx \frac{1}{(a+1) \cdot 2^r - a \cdot 2^r} \cdot \left[ \frac{(a+1) \cdot 2^r - a \cdot 2^r - d}{a \cdot 2^r} + \frac{d}{(a+1) \cdot 2^r} \right] \quad (4)$$

Simplification of Eq. (4) leads to:

$$\frac{1}{a \cdot 2^r + d} \approx \left[ \frac{a + 1 - d \cdot 2^{-r}}{a \cdot (a+1)} \right] \cdot 2^{-r} \quad (5)$$

The value of "r", an order variable, in the above equations is related to the most significant digit (MSD), which is defined as the highest-valued '1' digit in a binary word. For example, an eight-bit binary word representing the decimal number 122 is 01111010. Counting from 0 starting with the least significant bit (LSB), the MSD of this word is 6.

Thus, the order variable r can be described as:

$$r = MSD - m \quad (6)$$

where m is an index size and is related to the number of bits used to represent the variable "a". Typically, m is equal to the number of bits used to represent the variable "a" minus one.

Thus, Eq. (5) may be used to compute the inverse of the input value located between two integers with known inverses. The denominator of Eq. (5) represents the returned reference value. The variable d is the remainder. It is appreciated that variations of Eq. (5) and Eq. (6) may be used and still be in accordance with the present invention.

The second memory lookup table 108 may be partially implemented in memory. The memory may be any type of memory or storage device such as read only memory, dynamic access memory, flash memory, hard drives and the like. The second memory lookup table 108 stores a number of reference values used by the inverse function 106. Generally, the greater the number of reference values stored, the greater the accuracy of the inverse function 106. Also, the number of reference values is also related to the bit size of the input value. One exemplary implementation of the second memory lookup table 108 stores 64 reference values to provide 16 bits of accuracy.

The sine and inverse of the input value are multiplied together, thereby providing a sinc of the input value, and then received by a coefficient determinator 110. The coefficient determinator 110 computes a coefficient from the sinc of the input value as a function of system constants, filter constants, scaling, delays and the like.

The coefficient computed by the system 100 is described with respect to an FIR filter, however it is appreciated that alternate aspects providing systems for computing coefficients with respect to other types of filters, such as infinite impulse response (IIR), or any computation requiring sine or inverse computations are within the scope of the present invention.

It is appreciated that other variations of the system 100 are possible and that such variations are still within the scope of the present invention. For example, the components of system 100 may be used in other applications where sine, inverse and sinc functions are computed.

In view of the foregoing structural and functional features described above, a methodology in accordance with various aspects of the present invention will be better appreciated with reference to FIGS. 4-8. While, for purposes of simplicity of explanation, the methodologies of FIGS. 4-8 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

Figure 4:
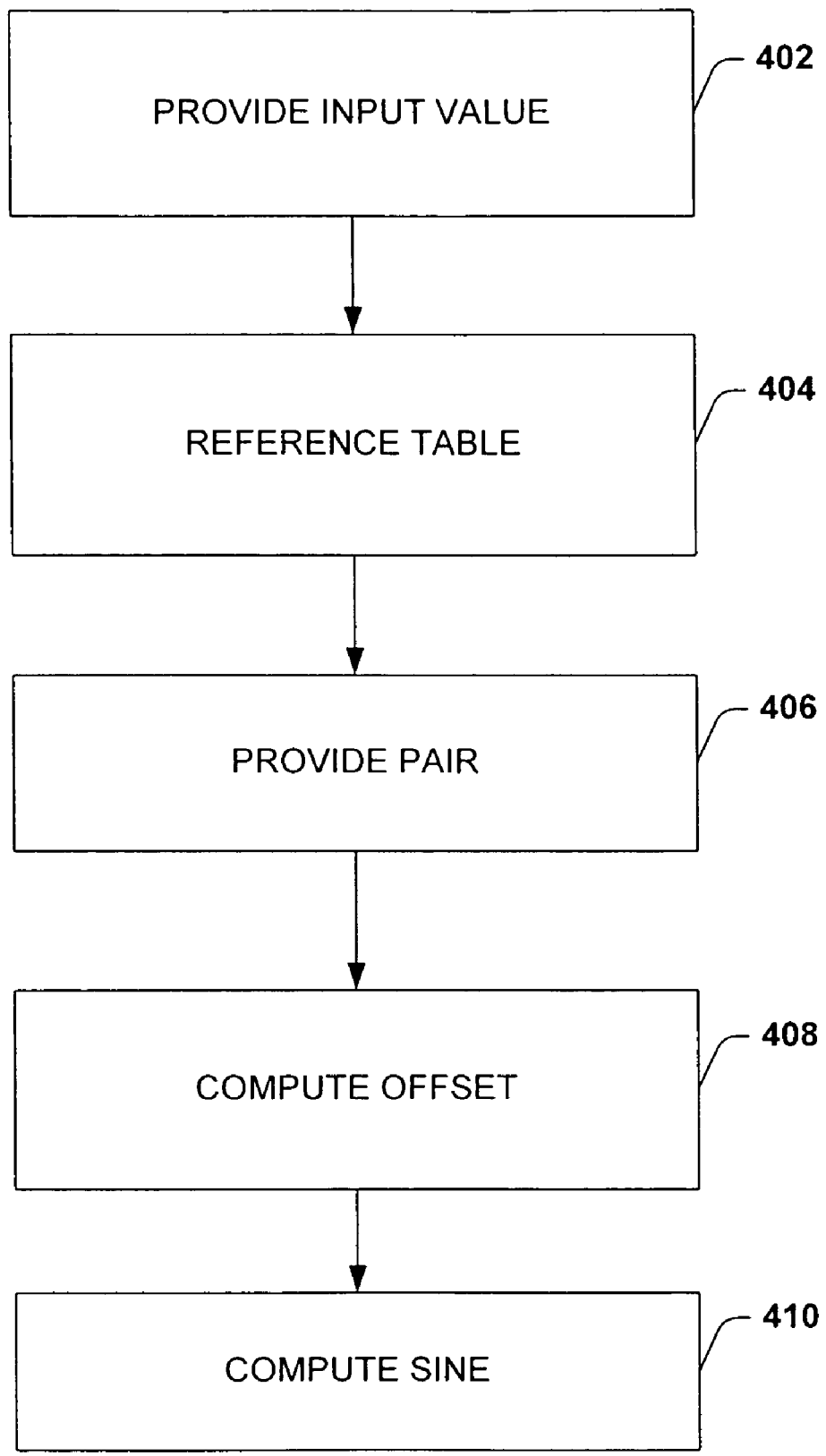
FIG. 4 is a flow diagram of a method of computing a sine function of a value according to another aspect of the present invention.

FIG. 4 is a flow diagram of a method of computing a sine function of a value according to another aspect of the present invention. An input value is provided at 402. The input value is one of a range of values for $\omega_0 n$, for n being an integer from 0 to N and $\omega_0$ being a cutoff frequency. Typically, $\omega_0$ is the desired cutoff frequency for a filter. A memory lookup table is referenced to find a closest tabled value to the input value at 404. The memory lookup table includes a number of pairs of sine/cosine values, where each pair has a predetermined sine and cosine computation of a tabled value.

The pairs of sine/cosine values stored in the memory lookup table are predetermined and the number of pairs stored in the memory lookup table corresponds to a desired accuracy. Generally, the more sine/cosine pairs used in the table, the more accurate the result. However, the sine and cosine are periodic, thus only sine/cosine values for 0 to 2π or 0 to π are stored in the memory lookup table. For example, 64 sine/cosine pairs over the range of 0 to π yield an accuracy of at least 16 bits. As described above, FIG. 2 illustrates sine/cosine pairs that may be stored in the memory lookup table. A sine/cosine pair of the closest tabled value is provided at 406. Examples of sine/cosine pairs are shown with respect to FIG. 2. The sine and cosine of the sine/cosine pair have values of −1 to 1.

An offset value is computed by subtracting the tabled value from the input value at 408. The offset value simply provides the difference between the input value and the tabled value of which the sine/cosine pair is obtained. The offset value indicates how close the sine/cosine pair of the tabled value is to the sine and/or cosine of the input value. The smaller the offset value, the smaller the difference and the closer the sine/cosine pair is to the actual sine/cosine of the input value. A sine value of the input value is computed, utilizing Eq. (3), by multiplying the offset times a sum of the cosine of the closest tabled value and a product of 0.5 times the offset and the sine of the closest tabled value and then adding the sine of the closest tabled value at 410. The sine value is an approximation, however it is a highly accurate approximation. Thus, 64 sine/cosine pairs stored yields an accuracy of at least 16 bits. It is apparent that 64 sine/cosine pairs use only a minimal amount of memory or storage space. Higher accuracies can be obtained by storing more pairs.

Figure 5:
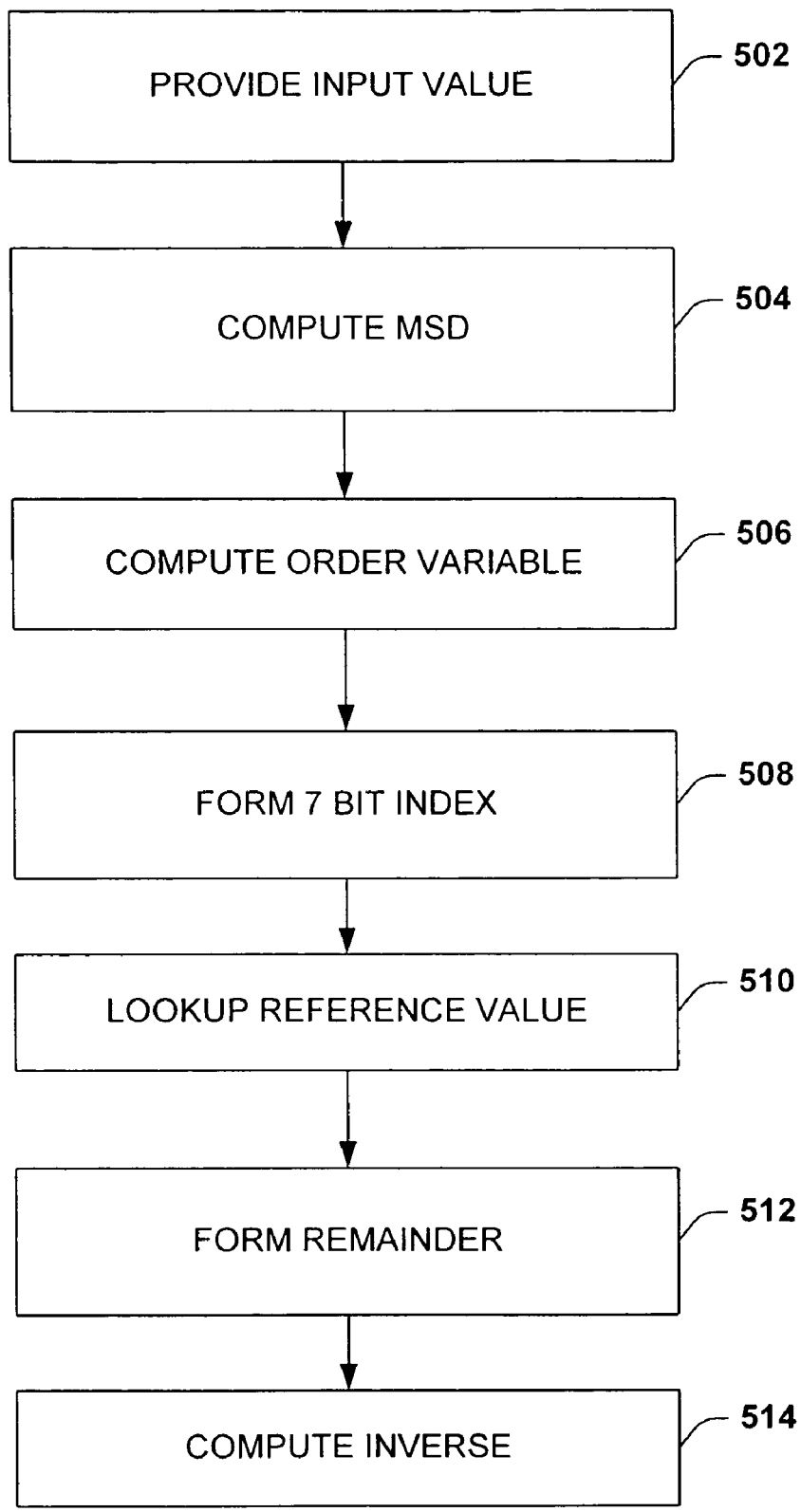
FIG. 5 is a flow diagram of a method of computing an inverse according to another aspect of the present invention.

FIG. 5 is a flow diagram of a method for computing an inverse according to another aspect of the invention. The method is shown applying to integers, but may also be applied to non-integers. This method uses an index size of 6 and a 64 element inverse memory reference table.

Computation of the inverse function may be approximated using piecewise linearization of the inverse function. FIG. 3 and its accompanying description shown above illustrates the use of piecewise linearization with respect to the inverse function.

An input value is provided at 502. The input value is represented as binary word. The input value corresponds to a coefficient for an FIR filter. The input value is one of a range of values of n, for n being an integer from 0 to N corresponding to a delay or TAP of the filter. In alternate aspects of the invention, the input value may include $\omega_0$, the cutoff frequency of the filter. The MSD of the input value is computed at 504. The term most significant digit (MSD) is defined as the highest-valued '1' digit in a binary word. For example, consider an eight-bit binary word representing the decimal number 122 is 01111010. Counting from 0 starting with the least significant bit (LSB), the MSD of this word is 6.

The order variable, is computed at 506 by subtracting 6, the index size, from the MSD. An index is formed from bits of the input value from the MSD toward the LSB at 508. The number of bits used to represent the index is 7. As an example, an input value of 011111010 may form an index of 1111010 by using the 7 bits from the MSD toward the LSB. The inverse memory reference table is referenced with the index to lookup a reference value at 510. However, only the lower 6 bits of the index are actually needed to reference the inverse memory reference table. The reference value is the inverse of a product of the index and a sum of the index plus 1. By utilizing a stored reference value, a division operation is avoided and thus, computational efficiency is increased.

The index has values between 64 and 127 ($2^6$ and $2^7-1$) can be represented using only the lower 6 bits, the index size. However, only 64 values need to be stored in the inverse memory reference table to provide 16-bit accuracy for inverses of all integers. Thus, only the next six bits need to be used to index the memory reference table.

A remainder is formed at 512 by removing the index from the input value. If the MSD is less than 7, the remainder is equal to 0. The remainder is a measure of the closeness of the input value to the index. The smaller the remainder, the closer the input value is to the index.

The inverse of the input value is computed as a function of the order variable, the reference value, the index and the remainder at 514. Eq. (5), shown above, may be used to compute the inverse of the input value where a is the index, r is the order variable, d is the remainder and the reference value is the inverse of $a \cdot (a+1)$.

Figure 6:
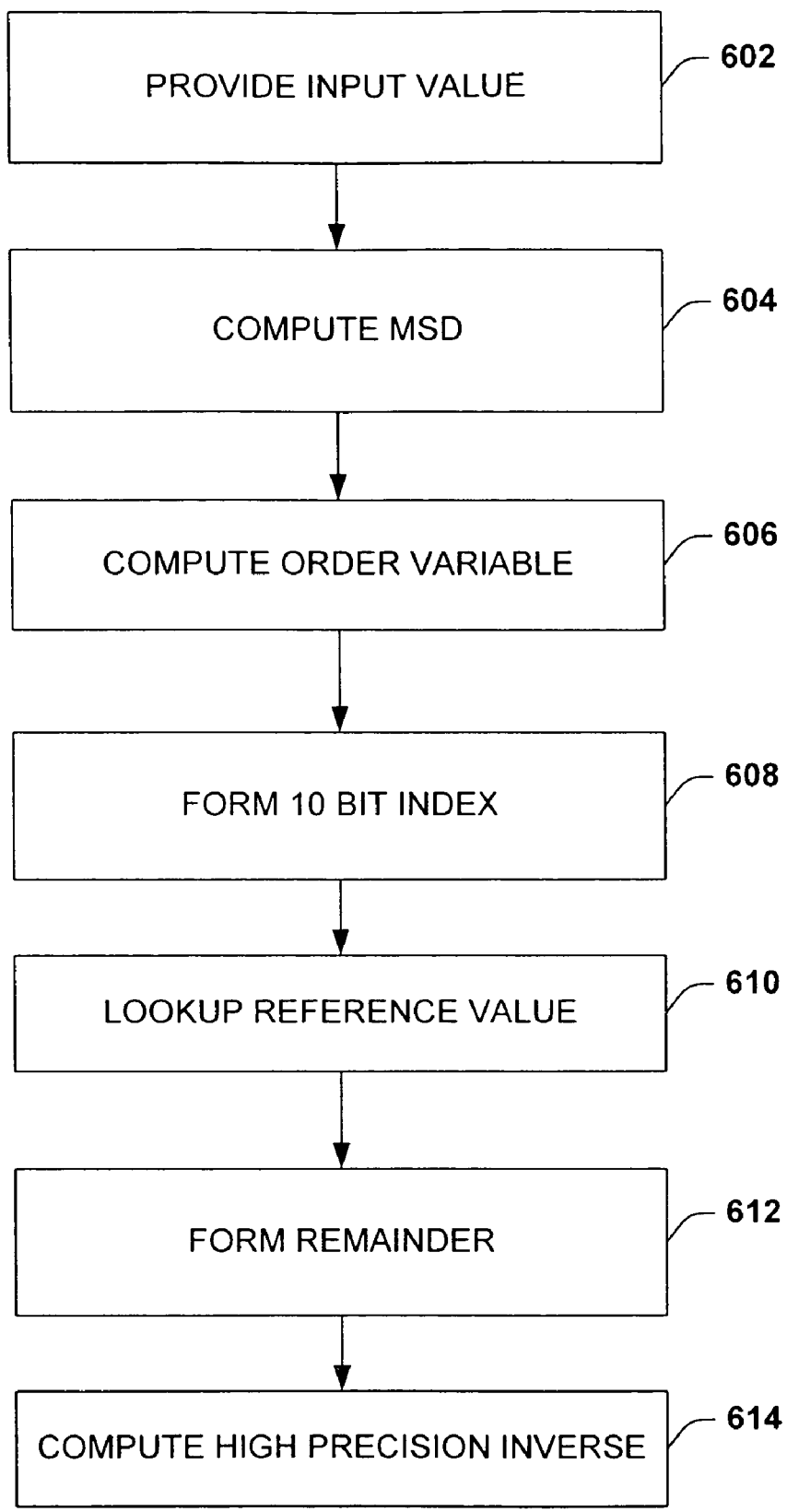
FIG. 6 is a flow diagram of a high precision method of computing an inverse according to yet another aspect of the present invention.

FIG. 6 is a flow diagram of a high precision method of computing an inverse according to another aspect of the present invention. This method computes an inverse to a higher precision than the method illustrated with respect to FIG. 5. This method uses an index size of 9 and 512 element inverse reference table to obtain the high precision computation.

An input value is provided at 602. The input value corresponds to a coefficient for an FIR filter. The input value is one of a range of values for n, for n being an integer from 0 to N corresponding to a delay or TAP of a filter. In alternate aspects of the invention, the input value may include $\omega_0$, the cutoff frequency of the filter. It is appreciated that the present invention may be extended to any bit size or representation of the input value.

The MSD of the input value is computed at 604. The order variable, is computed at 606 by subtracting 9, the index size, from the MSD. The order variable may be computed differently for different bit size representations. The order variable is the order of resulting equations used for computing the inverse. An index is formed from bits of the input value from the MSD toward the LSB at 608. The index is represented with 10 bits, however only the lower 9 bits, the index size, are needed since the highest bit is always equal to '1'. By permitting an index representation of up to 10 bits, the index is typically closer in value to the input value than lower bit representations, such as shown with respect to FIG. 5.

An inverse memory reference table is referenced with the index to lookup a reference value at 610. The reference value is the inverse of a product of the index and a sum of the index plus 1. Since the index is represented with 10 bits, the least significant 9 bits are used to address the table where values range from $1/(512 \cdot 513)$ to $1/(1023 \cdot 1024)$. The inverse memory reference table for this method is a 512 element, 32-bit table. The inverse memory reference table is larger than the example given with respect to FIG. 5, however the inverse memory reference table is still of a relatively small size.

A remainder is formed at 612 by removing the index from the input value. The remainder is a measure of how close the index is to the input value. If the MSD is less than 10, the remainder is equal to 0. It is noted that the value of the MSD is 1. The inverse of the input value is computed as a function of the order variable, the reference value, the index and the remainder at 614. Eq. (5), shown above, may be used to compute the inverse of the input value where a is the index, r is the order variable, d is the remainder and the reference value is the inverse of $a \cdot (a+1)$.

Figure 7:
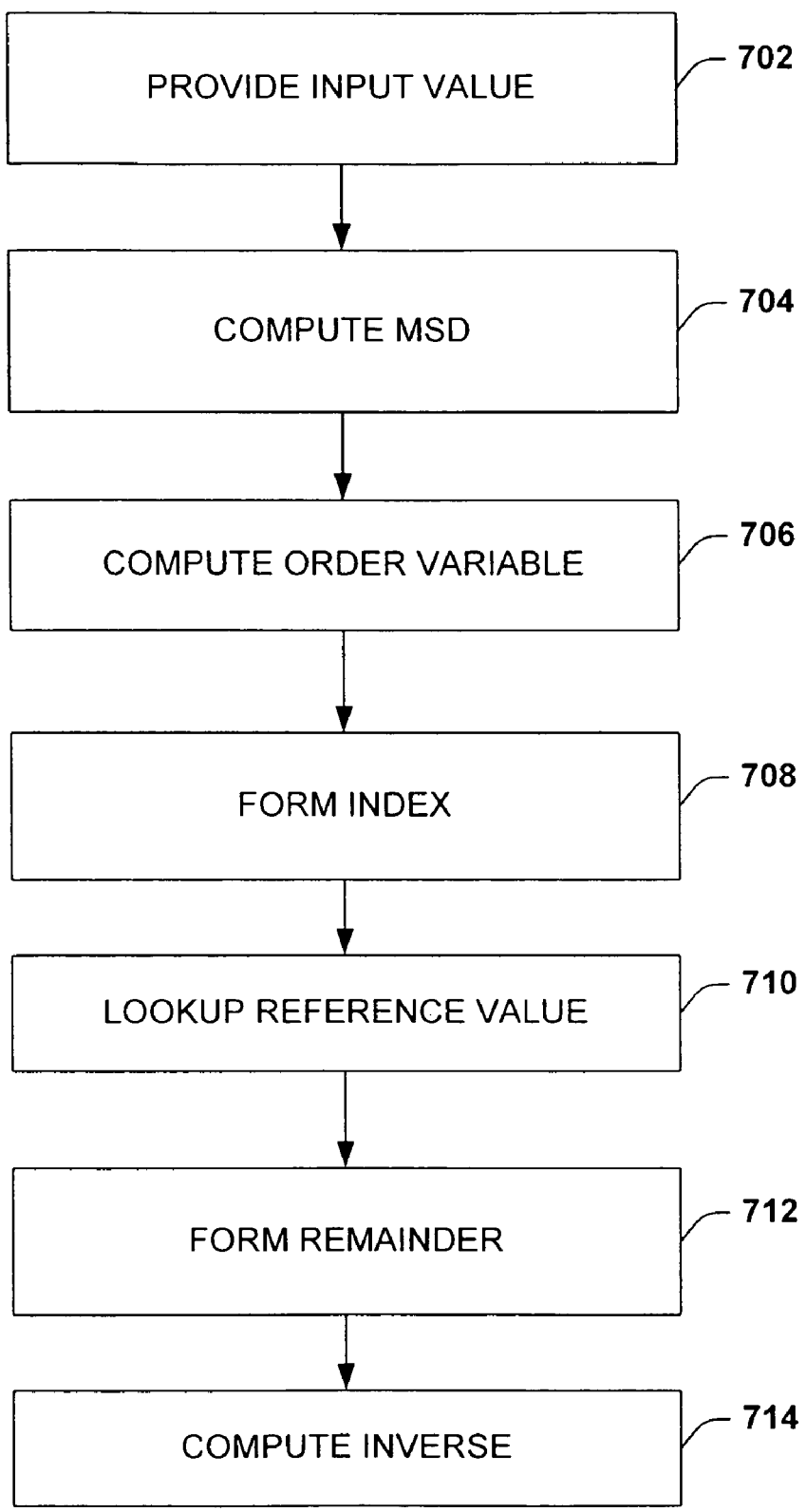
FIG. 7 is a flow diagram of a method of computing an inverse according to yet another aspect of the present invention.

FIG. 7 is a flow diagram of a high precision method of computing an inverse according to yet another aspect of the present invention.

An input value is provided at 702. The input value corresponds to a coefficient for an FIR filter. The input value is one of a range of values for n, for n being an integer from 0 to N corresponding to a delay or TAP of a filter. In alternate aspects of the invention, the input value may include $\omega_0$, the cutoff frequency of the filter.

The MSD of the input value is computed at 704. As shown above, the MSD is defined as the highest-valued '1' digit in a binary word. For example, an eight-bit binary word is 00111010. Counting from 0 starting with the least significant bit (LSB), the MSD of this word is 5 while the value of the MSD is '1'. An order variable, is computed at 706 by subtracting an index size from the MSD. The order variable is the order of a resulting equation used for computing the inverse. The index size is related to a number of values stored in an inverse memory reference table. For example, if the MSD is 8 and the index size is 6, the order is 2. It is appreciated that the value of the order may be positive or negative. An index is formed from bits of the input value from the MSD toward the LSB at 708. For example, the index for 00111010 is 11010. The inverse memory reference table is referenced with the index to lookup a reference value at 710. However, the highest bit of the index is always '1' so only the remaining, lower bits need to be used to lookup or address the inverse memory reference table to obtain the reference value. The reference value is the inverse of a product of the index and a sum of the index plus 1.

The inverse memory reference table stores values corresponding to index values of $2^m$ to $2^{m+1}-1$, where m is the index size from above. Thus, only $2^m$ values need to be stored in the inverse memory reference table. Further, the number of bits used to represent the index is m+1. It is appreciated that the index size and inverse memory reference table are determined and computed prior to using this method. It is also appreciated that a greater index size yields greater accuracy.

A remainder is formed at 712 by removing the index from the input value. The remainder provides a measure of how close the input value is to the index. The inverse of the input value is computed as a function of the order variable, the reference value, the index and the remainder at 714. Eq. (5), shown above, may be used to compute the inverse of the input value where a is the index, r is the order variable, d is the remainder and the reference value is the inverse of a·(a+1). It is appreciated that alternate aspects of the invention can use variations of Eq. (5) and still be within the scope of the present invention.

As described above, this method is described operating with positive values of n, or the input value. However, it is appreciated that the method can be modified in accordance with an alternate aspect of the invention to operate on negative values. The inverse of negative values can be computed by using the absolute value as the input value and multiplying the inverse of the input value computed from this method by negative one.

Figure 8:
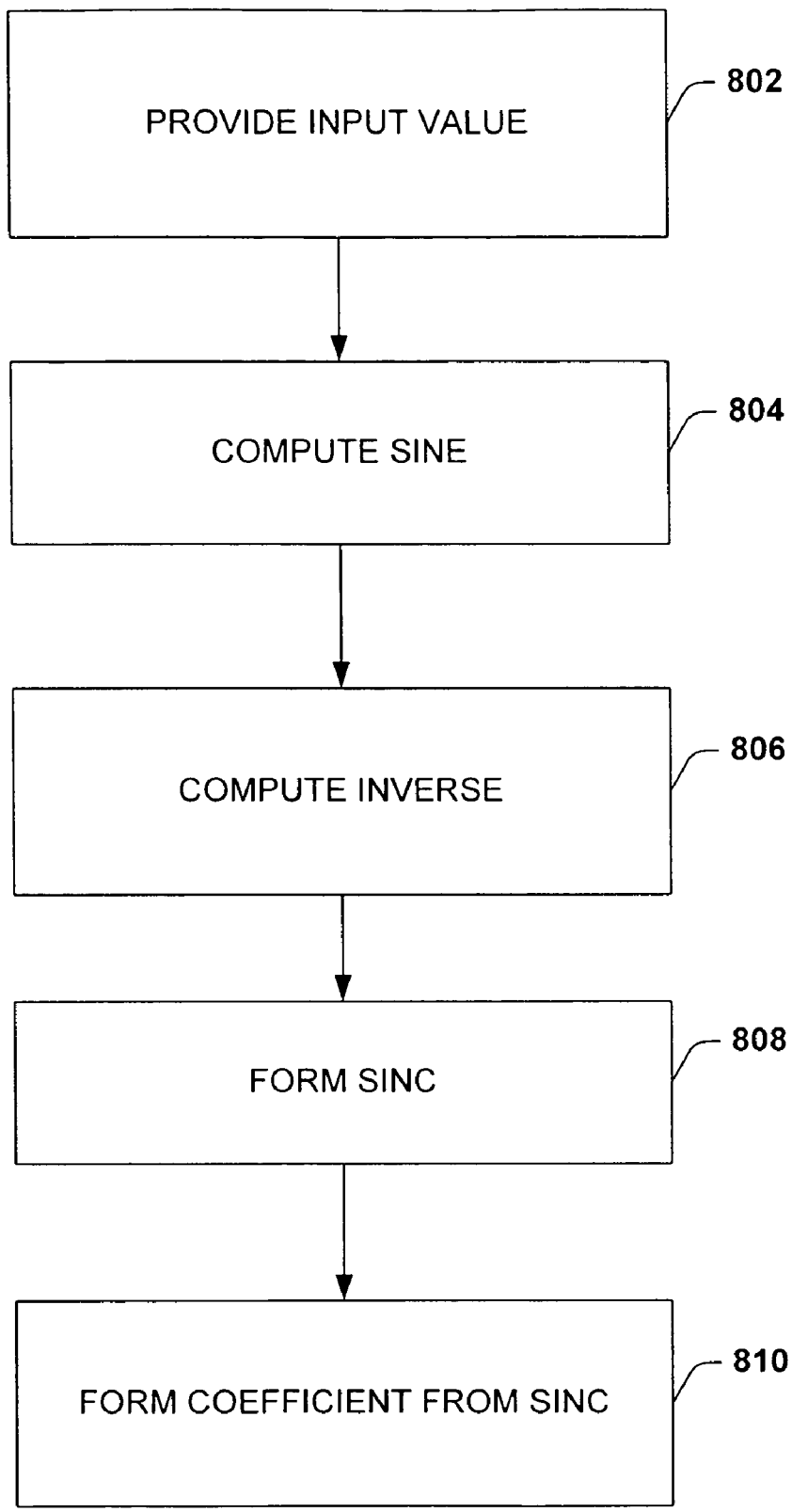
FIG. 8 is a flow diagram of a method of computing a coefficient according to yet another aspect of the present invention.

FIG. 8 is a flow diagram of a method of computing a coefficient of a linear phase FIR filter in real-time according to yet another aspect of the invention. The coefficient corresponds to a specific designed delay or TAP of the filter. Typically, the coefficient is computed at about the same time that an input signal sample is obtained. This method does not require storage of any coefficients of the FIR filter.

An input value is provided at 802. The input value corresponds to a specific designed delay and/or TAP of the FIR filter and an input sample of the input signal. The input value is one of a range of values for $\omega_0 n$, for n being an integer from 0 to N and $\omega_0$ being a cutoff frequency of the FIR filter. The $\omega_0$ is the desired cutoff frequency for a filter. A sine of the input value is computed to a desired accuracy utilizing a first lookup table containing sine/cosine pair values at 804. The desired accuracy is related to the number of sine/cosine pair values in the first lookup table and is not dependent on the input value. For example, 64 pairs of sine/cosine values yield an accuracy of 16 bits or better. The method of FIG. 3 is one method that can be used to compute the sine of the input value. However, other methods using trigonometric approximations can be used and still be within the scope of the present invention.

An inverse of the input value is computed utilizing piecewise linearization and a second lookup table at 806. A simplified form or modification of the input value may be used before computing the inverse of the input value because the cutoff frequency term is not required to be present for the input value. Additionally, the input value may be multiplied by π. The inverse of the input value may be computed using the methods described in FIG. 5, FIG. 6, FIG. 7 or variations thereof and still be within the scope of the present invention.

The second input table stores a number of reference values. The number of stored reference values relates to the accuracy of the inverse computation. However, previously computed coefficient values or inverse values are not necessarily stored or required for computing the inverse of the input value.

A product of the sine of the input value and the inverse of the input value forms the sinc of the input value at 808. The product of the sine and the inverse yields the sinc function (sinc(x)) shown as follows:

$$\frac{\sin(x)}{x} \qquad (7)$$

The impulse response, which is the set of coefficients, of an FIR filter is a function of:

$$h(n) = \frac{\sin(\omega_0 n)}{n\pi} \qquad (8)$$

Thus, the coefficient is formed from the sinc of the input value at 810. The coefficient may simply be equal to the sinc of the input value. Alternately, the sinc of the input value may be modified by a constant or other delay value to yield the coefficient.

It is appreciated that the method of FIG. 8 can be used repeatedly to compute any number of coefficients of an FIR filter in real-time. It is also appreciated that the method of FIG. 8 may be extended to include combining the coefficient with a sample of an input signal and accumulating the result.

Figure 9:
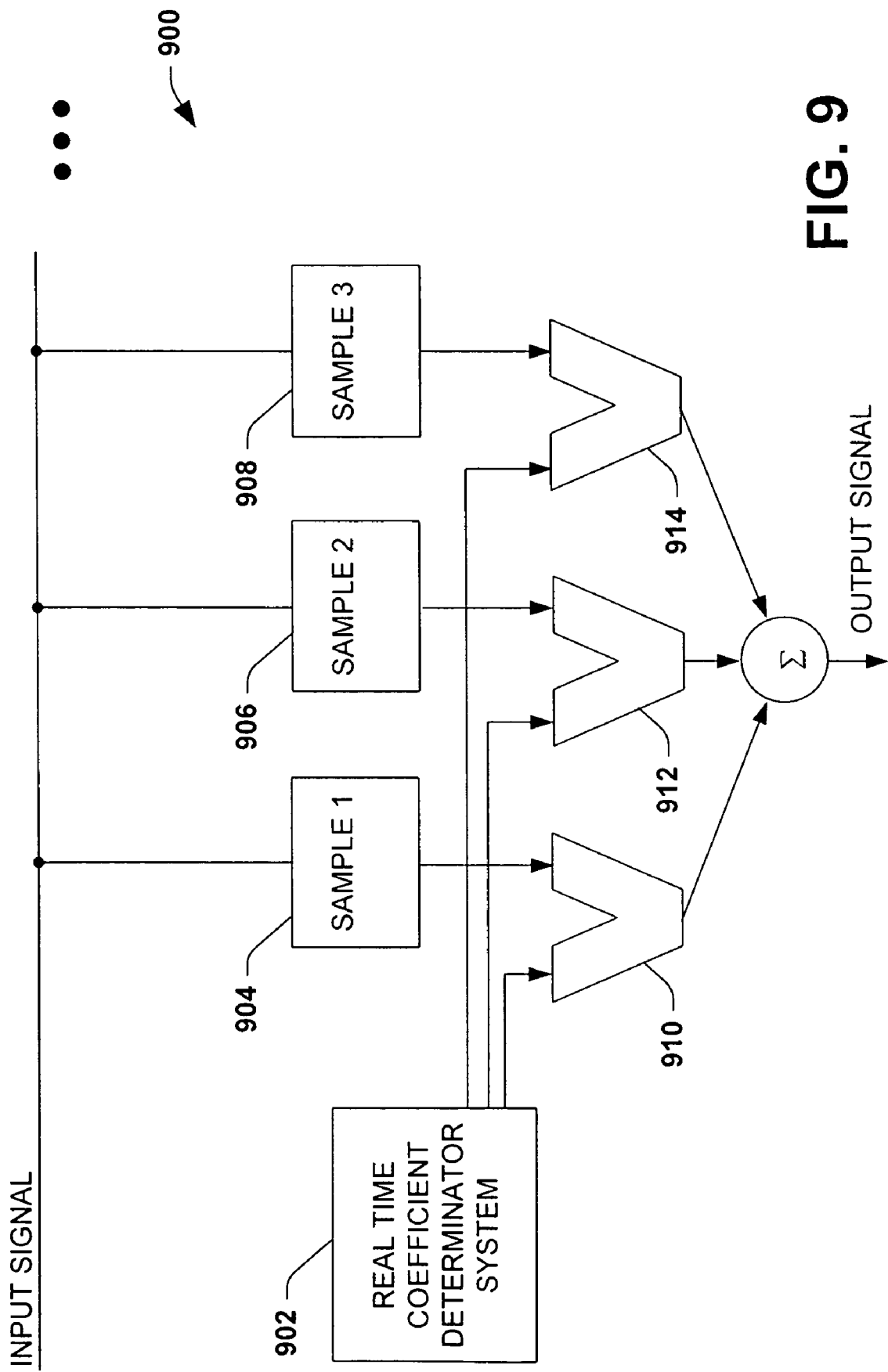
FIG. 9 is a block diagram of an FIR filter system according to yet another aspect of the present invention.

FIG. 9 illustrates an FIR filter system 900 according to yet another aspect of the present invention. For illustrative purposes only, the system 900 is shown with only three samples and corresponding coefficients, however it is appreciated that implementations can include sample and coefficients numbering above and beyond the millions. The system 900 needs much less memory than conventional FIR filter systems, which require storage of coefficients. The system 900 may use a tenth, a hundredth or less of the memory required in conventional FIR filter systems.

The FIR filter has filtering characteristics defined by its impulse response. The filtering characteristics may include low pass filtering, high pass filtering, band pass filtering, noise removal, decimation (reducing a sample rate), interpolation (increasing a sample rate) and the like. The impulse response is the finite set of all the coefficients of the filter. The FIR filter is further defined by the number of TAPs. A TAP, as previously defined, is a coefficient/delay pair. Each TAP provides a coefficient corresponding to a delay or frequency an input signal. Thus, various portions or frequencies of the input signal can be modified by the coefficients associated with those portions or frequencies.

The input signal is sampled to provide samples, 904, 906 and 908. Each sample is associated with a delay or frequency of the filter system 900 and the input signal. A sample and hold circuit may be used to obtain each sample. Each sample corresponds to a unique coefficient and/or TAP.

A real-time coefficient determinator system 902 computes a number of coefficients, where each coefficient corresponds to one of the samples. The coefficients are a function of a desired cutoff frequency or filter response. The real-time coefficient determinator system 902 uses the methods and/or systems described with respect to the present invention to compute the coefficients in real-time without requiring previously determined or stored coefficients.

Multipliers 910, 912 and 914 multiply the samples with their respective coefficients. The products are then added together to form the output signal.

The FIR filter system 900 is applicable to any signal processing system such as, but not limited to, communication systems, wireless communication systems, audio processing systems and the like. The FIR filter system 900 is particularly applicable to signal processing systems where real-time coefficient determination is important. The FIR filter system 900 is operable for any range of coefficients and has been shown to work with ranges of thousands of coefficients and millions of coefficients.

An exemplary implementation of the FIR filter system 900 has a total of four million coefficients. The system only needs to store 64 sine/cosine pairs and 64 reference values to yield an accuracy of about 18 bits. This accuracy of 18 bits ensures high performance operation and FIR filters having a signal-to-noise ratios (SNR) well above 100 dB.

FIG. 10 illustrates an application of the present invention to an audio decoder 1000. FIR filters are widely used in audio signal processing systems. FIR filters are used for noise reduction, interpolation, out-of-band filtering and the like.

The audio decoder system 1000 includes an FIR filter 1008 operative to receive a digital audio signal. The FIR filter 1008 is a linear digital filter. The FIR filter 1008 removes unwanted frequencies from the digital audio signal and provides a filtered digital signal. The FIR filter 1008 may remove out of band frequencies and/or noise from the digital audio signal.

To accomplish its desired filtering, the FIR filter 1008 is designed to have an impulse response that removes unwanted frequencies from the digital audio signal. The impulse response is a set of coefficients. The coefficients are multiplied with samples of the digital audio signal to yield the filtered signal. It is appreciated that alternate aspects of the invention may provide other processing such as, but not limited to, sample rate conversion.

Instead of storing coefficients, which would take up a considerable amount of memory and increase the cost and complexity of the FIR filter 1008, a real-time coefficient determinator 1006 computes the coefficients as needed during filtering. The real-time coefficient determinator 1006 utilizes a first memory lookup table 1002 and a second memory lookup table 1004. The first memory lookup table 1002 stores a number of sine/cosine pairs. The second memory lookup table 1004 stores a number of reference values. The first memory lookup table 1002 and the second memory lookup table 1004 may be implemented in separate memories or storage devices or may be located in the same memory or storage device.

The real-time coefficient determinator 1006 retrieves a pair of sine/cosine values from the first memory table 1002 and a reference value from the second memory lookup table 1004 and computes a coefficient as a function of the retrieved pair and the retrieved reference value for each sample of the digital audio signal. The real-time coefficient determinator 1006 generally uses trigonometric interpolation methods, such as described with respect to the present invention, and piecewise linear approximation methods, also as described with respect to the present invention. A digital to analog (D/A) converter 1010 is operative to receive the filtered signal from the FIR filter 1008 and provide an analog audio signal.

The decoder described with respect to FIG. 10, is but one of many possible uses of FIR filters according to the present invention. For example, FIR filters according to the present invention may be used in audio encoders, video encoders/decoders, sample rate converters (decimation and interpolation) and other signal processing systems.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A Finite Impulse Response (FIR) filter comprising:
 a plurality of sample and hold circuits operative to sample an input signal and to provide a plurality of input samples;
 a real-time coefficient determinator system including:
 a first lookup table;
 a second lookup table;
 a sine function generator that receives the input signal and that utilizes the first lookup table to generate a sine for each of the input samples;
 an inverse function generator that receives the input signal and that utilizes the second lookup table to generate an inverse for each of the input samples;
 a first multiplier that generates a sinc as a product of the corresponding sine and inverse for each of in the input samples; and
 a coefficient determinator that generates a coefficient for the sinc for each input sample;
 a plurality of second multipliers that are each coupled to at least one of the sample and hold circuits and the real-time coefficient determinator system; and
 an accumulator that is coupled to each second multiplier so as to provide a filtered signal.

2. The filter of claim 1, wherein the input signal and the filtered signal are digital.

3. The filter of claim 1, wherein the first lookup table stores sine/cosine pairs.

4. The filter of claim 3, wherein the second memory lookup table stores reference values.

5. The filter of claim 1, wherein the real-time coefficient determinator system is operative to compute at least a million coefficients in real-time while having at least an accuracy of about 18 bits.

6. The filter of claim 5, the filter has a signal-to-noise ratio of at least 100 dB.

7. The filter of claim 1, wherein the real-time coefficient determinator system is operative to compute at least a thousand coefficients in real-time while having at least an accuracy of about 18 bits.

8. An FIR filter comprising:
 a plurality of sample and hold circuits operative to sample an input signal and to provide a plurality of input samples;
 a real-time coefficient determinator system that computes a sine for each the input sample utilizing a first lookup table, that computes an inverse of each input sample utilizing a second lookup table, and that computes a sinc of the input value as a product of the corresponding sine and inverse for each input sample to generate coefficient for each sample;
 a plurality of multipliers that are each coupled to at least one of the sample and hold circuits and the real-time coefficient determinator system; and
 an accumulator that is coupled to each multiplier so as to provide a filtered signal.

9. The filter of claim 8, wherein the input signal and the filtered signal are digital.

10. The filter of claim 8, wherein the first lookup table stores sine/cosine pairs.

11. The filter of claim 10, wherein the second memory lookup table stores reference values.

12. The filter of claim 8, wherein the real-time coefficient determinator system is operative to compute at least a million coefficients in real-time while having at least an accuracy of about 18 bits.

13. The filter of claim 12, the filter has a signal-to-noise ratio of at least 100 dB.

14. The filter of claim 8, wherein the real-time coefficient determinator system is operative to compute at least a thousand coefficients in real-time while having at least an accuracy of about 18 bits.

\* \* \* \* \*

UNITED STATES PATENT AND TRADEMARK OFFICE
CERTIFICATE OF CORRECTION

PATENT NO. : 7,664,808 B2
APPLICATION NO. : 11/159618
DATED : February 16, 2010
INVENTOR(S) : Jiang et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1273 days.

Signed and Sealed this

Twenty-eighth Day of December, 2010

David J. Kappos
*Director of the United States Patent and Trademark Office*